(12) United States Patent
Dastidar

(10) Patent No.: US 7,131,043 B1
(45) Date of Patent: Oct. 31, 2006

(54) AUTOMATIC TESTING FOR PROGRAMMABLE NETWORKS OF CONTROL SIGNALS

(75) Inventor: Jayabrata Ghosh Dastidar, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 533 days.

(21) Appl. No.: 10/671,891

(22) Filed: Sep. 25, 2003

(51) Int. Cl.
*G01R 31/28* (2006.01)

(52) U.S. Cl. ....................................... 714/725; 714/733

(58) Field of Classification Search ................ 714/727, 714/724, 744, 725, 733; 365/201; 716/16
See application file for complete search history.

(56) References Cited

U.S. PATENT DOCUMENTS

| | | | | |
|---|---|---|---|---|
| 5,260,947 A | * | 11/1993 | Posse | 714/727 |
| 5,301,156 A | * | 4/1994 | Talley | 365/201 |
| 5,477,549 A | * | 12/1995 | Kamagata et al. | 714/733 |
| 5,732,246 A | * | 3/1998 | Gould et al. | 716/16 |
| 6,615,377 B1 | * | 9/2003 | da Cruz et al. | 714/724 |
| 6,671,848 B1 | * | 12/2003 | Mulig et al. | 714/744 |

* cited by examiner

*Primary Examiner*—David Ton
(74) *Attorney, Agent, or Firm*—Townsend and Townsend and Crew LLP

(57) ABSTRACT

Techniques are provided for testing routing resources that route control signals on programmable integrated circuits (ICs). Control signals (such as clock signals) are routed through a logic gate to a test register. Values of the control signals are stored in the test register, transmitted outside the IC, and then compared to expected values to identify defects in the programmable interconnections. An enable circuit couples the control signals to functional registers on the programmable IC during user mode. The enable circuit decouples the control signals from the functional registers so that the control signals do not interfere with tests of the functional registers during test mode. During the test procedures, the control signals are treated as data signals and are not used to control other registers on the IC.

20 Claims, 2 Drawing Sheets

AUTOMATIC TESTING FOR PROGRAMMABLE NETWORKS OF CONTROL SIGNALS

BACKGROUND OF THE INVENTION

This application relates to techniques for automatically testing circuits, and more particularly, to techniques for testing programmable networks of control signals.

Field programmable gate arrays (FPGAs) are programmable integrated circuits that include logic elements, memory, and programmable interconnect conductors. The logic elements, memory, and the interconnect conductors can be programmed to implement a number of different user designs. The logic elements typically include combinatorial and sequential logic circuits.

After an FPGA is manufactured, the logic elements, memory, and programmable connections in the interconnect structure are tested to ensure that they are operating properly. Tests are performed to detect the presence of any manufacturing detects in the FPGA.

Programmable interconnects that route control signals are tested functionally, by observing their effect on functional registers. For example, all programmable interconnections that can connect a clock signal to a clock input of a functional register are tested one at a time. Functional registers are registers that can be programmed and operated during user mode. The tests are performed to determine if the clock signal clocked the function register as expected. If the functional register was not clocked correctly, the programmable interconnections or the clock path may contain defects that prevent proper operation of the functional register.

It is expensive to test all of the programmable interconnections that constitute the programmable network for the controls signals in this way, because a large number of configurations is needed to test all of the interconnections. Because the tests are functional and the same registers are used for observation, a clock connection cannot be tested at the same time as a clear connection on the same register.

Therefore, it would be desirable to provide more efficient and cost effective techniques for testing networks of programmable resources that route control signals through a programmable integrated circuit.

BRIEF SUMMARY OF THE INVENTION

The present invention provides techniques for automatically testing resources that route control signals on programmable integrated circuits (ICs). Programmable ICs have a programmable interconnect structure that connects programmable logic elements, memory, and other on-chip circuit elements.

The techniques of the present invention can be used to test networks of programmable interconnections that route control signals to registers on a programmable IC. According to the present invention, control signals (such as clock signals) are routed through a logic gate to a dedicated test register. Values of the control signals are stored in the test register, transmitted outside the IC, and then compared to expected values to identify defects in the programmable interconnections.

An enable circuit couples the control signals to functional registers on the programmable IC during user mode. The enable circuit decouples the control signals from the functional registers during test mode, so that the control signals do not interfere with tests of the functional registers. During the test procedures of the present invention, the control signals are treated as data signals and are not used to control other registers on the IC. The control signals are only routed to the dedicated test register during test mode.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
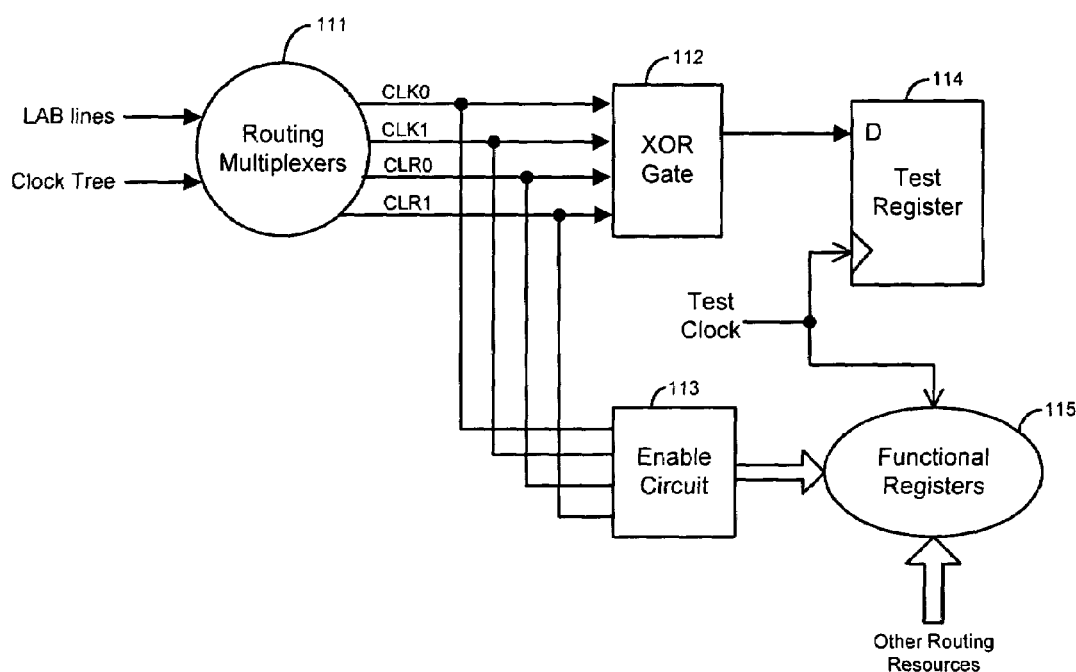
FIG. 1 is a block diagram of a system for testing programmable interconnections that route control signals on a programmable IC according to an embodiment of the present invention.

FIG. 1 is a block diagram that illustrates a test system for a programmable IC according to an embodiment of the present invention. Programmable ICs include FPGAs, programmable logic devices (PLDs), programmable logic arrays (PLAs), configurable logic arrays, etc.

Programmable integrated circuits (ICs) contain a programmable routing structure that includes rows and columns of interconnect conductors. The interconnect conductors can be programmably coupled together (or decoupled) using programmable interconnection circuits. The interconnect conductors and programmable interconnection circuits are referred to as routing resources.

Most of the programmable routing resources are used to route data signals within a programmable IC. However, a dedicated subset of the programmable routing resources are used to route control signals within programmable ICs. For example, a clock tree is dedicated set of routing resources that is used to route clock signals applied to input pins on an IC. In a programmable IC, the clock tree routing resources are programmable.

Programmable ICs also include routing resources that route control signals between programmable logic elements. In Altera's Stratix family of FPGAs, sets of logic elements and other circuit elements are grouped into logic array blocks (LABs). The routing resources that route signals to LABs are referred to as LAB lines in FIG. 1.

According to the present invention, an automatic test generator creates test paths to test programmable routing resources that route control signals. The test paths start from clock input pins, input/output (I/O) pins, or source registers. The test paths are routed through the programmable routing resources, through a logic gate, and end at dedicated test registers.

The test generator also generates test vectors that can test the test paths for structural defects such as stuck-at defects, continuity defects, and bridging faults. The present invention can test routing resources that route control signals such as clock signals, clear signals, clock enable signals, and other types of control signals.

FIG. 1 illustrates an example of a test path of the present invention. A test generator of the present invention can generate a test path originating from a clock input pin or from a source register in a LAB. Test paths originating from a clock pin are connected to routing multiplexers 111 through the clock tree inputs as shown in FIG. 1. Test paths originating from LABs are connected to routing multiplexers 111 through the LAB lines.

Routing multiplexers 111 are routing resources that route control signals through the test paths to XOR gate 112 as shown in FIG. 1. XOR gate 112 applies a very well-known exclusive OR Boolean function to its input signals. Test register 114 is the destination register of a test path. Register 114 is a dedicated test register that is only used for testing the routing resources that route the control signals. Test register 114 is not programmed or operated during user mode. Test register 114 stores the output signal of XOR gate 112 on each rising edge of the Test Clock signal applied to its clock input.

In the example of FIG. 1, the test generator routes four control signal through test paths from a clock pin or source register through XOR gate 112 to test register 114. Clock/clear signals CLK0, CLK1, CLR0, and CLR1 are examples of four control signals that can be tested by the present invention. All four clock/clear signals CLK0, CLK1, CLR0, and CLR1 are routed to inputs of XOR gate 112.

The test generator of the present invention creates test vectors to test the programmable routing resources. The test vectors are applied sequentially to the clock pins and the source registers. The values of signals CLK0, CLK1, CLR0, and CLR1 vary with each new test vector applied to a source register or clock pin. For each binary value of the four input control signals, XOR gate 112 generates an unique output signal value. Each output signal value is applied to the data input D of test register 114 and stored briefly in test register 114.

Test register 114 sequentially stores a series of output values generated by XOR gate 112 in response to the different test vectors. Test register 114 then transmits each value generated by XOR 112 outside the IC. An external test system compares the XOR gate generated values to expected values to identify any defects in routing multiplexers 111 and any other control signal routing resources. If some of the signals from XOR gate 112 do not match expected values, a defect in routing multiplexers 111 or any other control signal routing resources is a possible cause.

Routing multiplexers 111 can be reprogrammed to test another set of programmable interconnections. A new set of four control signals are applied to inputs of XOR gate 112, stored in register 114, and tested externally.

Every control signal on a programmable IC can be tested using the circuitry of FIG. 1. After a sufficient amount of test data has been accumulated, routing resources containing defects can be isolated by a process of elimination using well-known techniques. By determining which sets of test vectors lead to erroneous output values from XOR gate 112, a test system can isolate the location of defects in the routing resources.

The control signals tested by XOR gate 112 are used to control numerous registers on the programmable IC during normal operation of the circuit. These registers are represented by functional registers 115 in FIG. 1. The functional resisters are typically registers inside logic elements on the programmable IC that are programmed and operated in the user mode. During the user mode, the programmable IC is configured according to a user made design.

The functional resisters 115 are also tested for defects after production of the programmable IC. Functional registers 115 are coupled in test paths. The tests can be controlled by the test clock signal.

When the functional registers are tested during test mode, enable circuit 113 decouples the control signals (CLK0, CLK1, CLR0, CLR1) from functional registers 115 so that registers 115 and other routing resources can be tested independently from the control signals. Enable circuit 113 couples the control signals to functional registers 115 during the user mode of the programmable IC. Enable circuit 113 has an output signal line for each control signal input. A handful of functional patterns can test the paths from the control signals through enable circuit 113 to functional registers 115.

The present invention provides techniques for testing networks of routing resources that route control signals on a programmable IC. The control signals are treated as data signals during the test procedure. The controls signals are decoupled from the functional registers 115 that they control during user mode. Values of the control signals are sampled by a dedicated test register 114 after passing through a logic gate as discussed above to detect defects in the routing resources.

The present invention substantially reduces the costs associated with testing interconnections (e.g., by 50%). The present invention also simplifies test generation. The present invention has a negligible effect on die size of the integrated circuit, because the only additional circuitry that needs to be added to an FPGA is XOR gate 112 and test register 114. The techniques of the present invention are also less susceptible to test mode glitches. The present invention also allows for additional structural testing like testing for bridging faults.

An XOR gate is used in FIG. 1 as an example. Other logic gates that implement other Boolean functions (e.g., AND or OR Boolean functions) can also be used in alternative embodiments of the present invention. Also, XOR gate 112 can be substituted with a multiplexer. In other embodiments, XOR gate 112 can receive more or less than 4 control signals.

Figure 2:
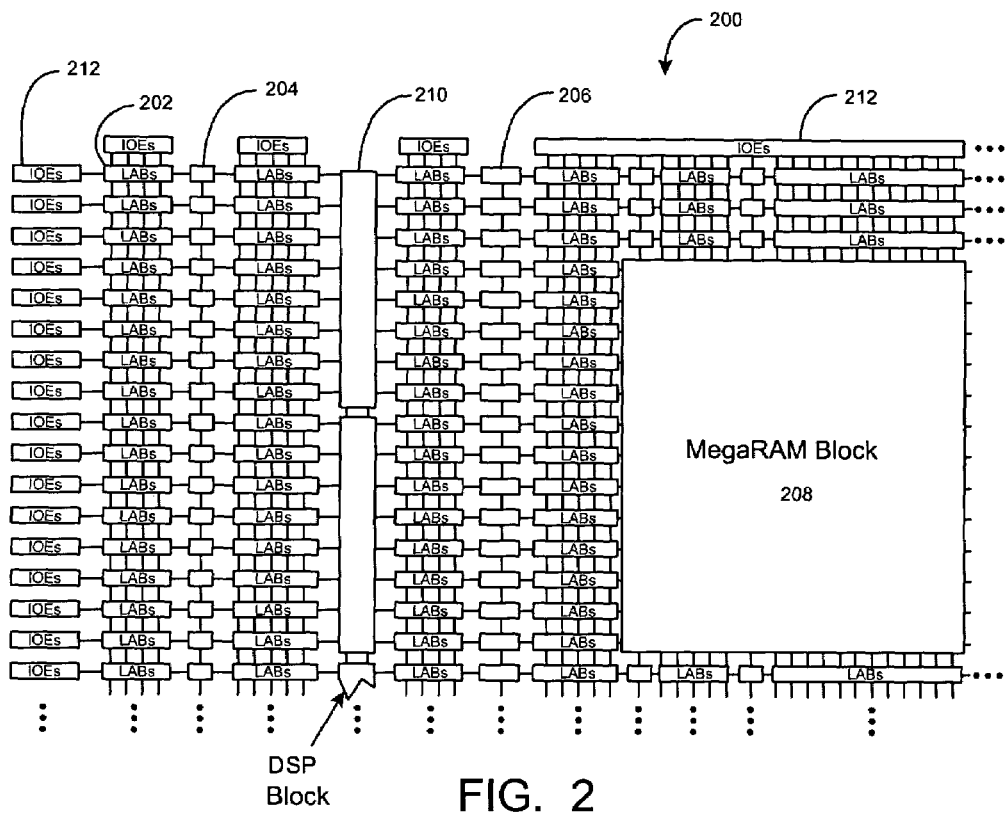
FIG. 2 is a simplified block diagram of a programmable logic device that can implement embodiments of the present invention.

FIG. 2 is a simplified partial block diagram of an exemplary high-density PLD 300 wherein techniques of the present invention can be utilized. PLD 300 includes a two-dimensional array of programmable logic array blocks (or LABs) 302 that are interconnected by a network of column and row interconnects of varying length and speed. LABs 302 include multiple (e.g., 10) logic elements (or LEs), an LE being a small unit of logic that provides for efficient implementation of user defined logic functions.

PLD 300 also includes a distributed memory structure including RAM blocks of varying sizes provided throughout the array. The RAM blocks include, for example, 512 bit blocks 304, 4K blocks 306 and a MegaBlock 308 providing 512K bits of RAM. These memory blocks can also include shift registers and FIFO buffers. PLD 300 further includes digital signal processing (DSP) blocks 310 that can implement, for example, multipliers with add or subtract features. I/O elements (IOEs) 312 located, in this example, around the periphery of the device support numerous single-ended and differential I/O standards. It is to be understood that PLD 300 is described herein for illustrative purposes only and that the present invention can be implemented in many different types of PLDs, FPGAs, and the like.

Figure 3:
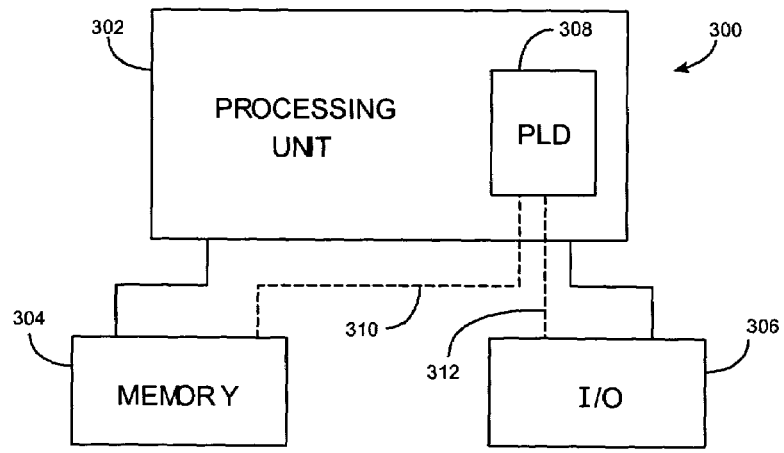
FIG. 3 is a block diagram of an electronic system that can implement embodiments of the present invention.

While PLDs of the type shown in FIG. 2 provide many of the resources required to implement system level solutions, the present invention can also benefit systems wherein a PLD is one of several components. FIG. 3 shows a block diagram of an exemplary digital system 400, within which the present invention can be embodied. System 400 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 400 can be provided on a single board, on multiple boards, or within multiple enclosures.

System 400 includes a processing unit 402, a memory unit 404 and an input/output (I/O) unit 406 interconnected together by one or more buses. According to this exemplary embodiment, a programmable logic device (PLD) 408 is embedded in processing unit 402. PLD 408 can serve many different purposes within the system in FIG. 3. PLD 408 can, for example, be a logical building block of processing unit 402, supporting its internal and external operations. PLD 408 is programmed to implement the logical functions necessary to carry on its particular role in system operation. PLD 408 can be specially coupled to memory 404 through connection 410 and to I/O unit 406 through connection 412.

Processing unit 402 can direct data to an appropriate system component for processing or storage, execute a program stored in memory 404 or receive and transmit data via I/O unit 406, or other similar function. Processing unit 402 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 408 can control the logical operations of the system. In an embodiment, PLD 408 acts as a reconfigurable processor, which can be reprogrammed as needed to handle a particular computing task. Alternately, programmable logic device 408 can itself include an embedded microprocessor. Memory unit 404 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications can be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A method for testing routing resources for control signals on a programmable integrated circuit (IC), the method comprising:
   automatically generating test paths on the programmable IC, each test path including routing resources that route the control signals, a logic gate, and a dedicated test register, wherein the test register is not used in a user mode of the programmable IC;
   applying test vectors to the routing resources for the control signals;
   performing a logic function on the test vectors using the logic gate to generate test output values;
   sequentially storing the test output values in the dedicated test register; and
   comparing the test output values to expected values to isolate defects in the routing resources.

2. The method according to claim 1 wherein the routing resources are programmable interconnect resources that route clock signals.

3. The method according to claim 1 wherein the routing resources are programmable interconnect resources that route clear signals.

4. The method according to claim 1 wherein the routing resources are programmable interconnect resources that route clock enable signals.

5. The method according to claim 1 further comprising:
   decoupling the control signals from functional registers on the IC.

6. The method according to claim 1 wherein each of the test paths begins at a source register.

7. The method according to claim 1 wherein each of the test paths begins at a clock pin.

8. The method according to claim 1 wherein the logic gate is an XOR gate.

9. The method according to claim 1 wherein the logic gate is a multiplexer.

10. The method according to claim 1 wherein the programmable IC is a field programmable gate array.

11. The method according to claim 1 further comprising:
    coupling the control signals to the functional registers when the programmable IC is operated during a user mode.

12. A programmable integrated circuit comprising:
    routing resources for routing control signals on the programmable integrated circuit;
    a logic gate coupled to receive the control signals from the routing resources that generates output test values during a test mode;
    a dedicated test register for sequentially storing the output test values during the test mode, wherein the dedicated test register is not operated during a user mode; and
    an enable circuit that decouples the control signals from functional registers during the test mode and that couples the control signals to the functional registers during a user mode.

13. The programmable integrated circuit according to claim 12 wherein the routing resources are programmable interconnect resources that route clock signals.

14. The programmable integrated circuit according to claim 12 wherein the routing resources are programmable interconnect resources that route clear signals.

15. The programmable integrated circuit according to claim 12 wherein the routing resources are programmable interconnect resources that route clock enable signals.

16. The programmable integrated circuit of claim 12 wherein the logic gate is an XOR gate.

17. The programmable integrated circuit of claim 12 wherein the functional registers are located in logic elements on a field programmable gate array.

18. The programmable integrated circuit of claim 12 wherein the control signals are generated by logic elements on the programmable integrated circuit.

19. The programmable integrated circuit of claim 12 wherein the programmable integrated circuit is part of a digital system that includes a processor, memory and an I/O unit.

20. The programmable integrated circuit of claim 12 wherein the logic gate is a multiplexer.

* * * * *